United States Patent
Ramirez

(10) Patent No.: US 9,976,870 B2
(45) Date of Patent: May 22, 2018

(54) ELECTRICITY METER ISOLATED PHYSICAL LAYER ETHERNET INTERFACE

(71) Applicant: Landis+Gyr LLC, Lafayette, IN (US)

(72) Inventor: Anibal Diego Ramirez, Indianapolis, IN (US)

(73) Assignee: Landis+Gyr LLC, Lafayette, IN (US)

( * ) Notice: Subject to any disclaimer, the term of this patent is extended or adjusted under 35 U.S.C. 154(b) by 849 days.

(21) Appl. No.: 14/015,498

(22) Filed: Aug. 30, 2013

(65) Prior Publication Data

US 2015/0061886 A1    Mar. 5, 2015

(51) Int. Cl.
| | |
|---|---|
| *G08B 23/00* | (2006.01) |
| *G08C 15/06* | (2006.01) |
| *G08C 19/22* | (2006.01) |
| *H04Q 9/00* | (2006.01) |
| *G01D 4/00* | (2006.01) |
| *G01R 22/06* | (2006.01) |

(52) U.S. Cl.
CPC ........... *G01D 4/002* (2013.01); *G01R 22/063* (2013.01); *G01R 22/065* (2013.01); *Y02B 90/241* (2013.01); *Y02B 90/246* (2013.01); *Y04S 20/32* (2013.01); *Y04S 20/42* (2013.01)

(58) Field of Classification Search
CPC .......................................... G01D 4/002–4/006
USPC ................... 340/870.02–870.3; 361/157; 709/217–219, 57–79, 203
See application file for complete search history.

(56) References Cited

U.S. PATENT DOCUMENTS

| | | | |
|---|---|---|---|
| 5,968,137 A * | 10/1999 | Ferraiolo | H04L 12/2697 |
| | | | 341/4 |
| 7,805,262 B2 | 9/2010 | Slater et al. | |
| 8,219,214 B1 * | 7/2012 | Mimlitz | G05B 15/02 |
| | | | 340/3.1 |
| 8,432,655 B2 | 4/2013 | Voisine et al. | |
| 2002/0118119 A1 * | 8/2002 | Hammond | G01D 4/002 |
| | | | 340/870.02 |

* cited by examiner

*Primary Examiner* — Firmin Backer
*Assistant Examiner* — Jerold Murphy
(74) *Attorney, Agent, or Firm* — Maginot, Moore & Beck LLP

(57) ABSTRACT

A metering arrangement includes at least a first and second meter. The first meter includes a first metrology circuit, an Ethernet controller, and an isolation circuit. The first metrology circuit has a first data interface. The Ethernet controller has an Ethernet port and a conversion circuit coupled to convert Ethernet standard signals having a first communication protocol to signals of a second communication protocol. The isolation circuit is coupled between the Ethernet controller and the first data interface. The Ethernet controller is operably coupled to communicate data with the first data interface via the isolation circuit, and the conversion circuit is further operably coupled to communicate data via the first data port. The second meter includes a second metrology circuit having a second data interface operably connected to a second data port. The second data port is operably coupled to communicate data with the first data port.

21 Claims, 4 Drawing Sheets

ELECTRICITY METER ISOLATED PHYSICAL LAYER ETHERNET INTERFACE

FIELD OF THE INVENTION

The present invention relates generally to the field of electricity meters, and particularly to data communication in electricity meters.

BACKGROUND

Electricity meters that measure energy consumption or power consumption typically connect between a utility power line and a load. For example, an electricity meter for a residential customer is often connected at the point at which the electrical system of the residence connects to the utility line. The meter may thereby perform measurements regarding the energy consumed by the load. The utility service provider uses the information measured by the meter for billing and other purposes.

Meters convey energy consumption information to the utility service provider in many different ways. In a simple form, the meter includes an electronic display or mechanical counters on which energy consumption information is displayed. The utility service provider then employs a utility meter reader to visit the site of the meter to obtain the displayed information. In other cases, energy consumption information may be conveyed remotely by circuits within the meter. To this end, the meter circuitry can include or be attached to a telephone modem, a power line communication modem, or wireless communication device. The ability to remotely communicate metering information is known as automatic meter reading or "AMR".

Meters capable of remote communication for AMR often take advantage of the communication ability for other purposes. For example, utility service providers can use AMR communication systems to provide updates to meter software, updates to calibration values within the meter, obtain diagnostic information, and even operate switches within certain types of meters.

Despite the varied uses of remote meter communication, individual meters nevertheless tend to perform remote communication operations infrequently. Accordingly, the cost and inconvenience of providing communication equipment and associated connections are not always justified. However, in cases were multiple meters can be accessed via a single communication network interface, the cost of AMR and related remote communication services becomes more attractive. For example, in retail commercial, multi-family dwellings, and industrial settings, several meters for several customers may be located in a single place. For example, it is known to have an array of meters in a service room at an apartment building. In such cases, power lines are fed to the service room, and are branched off to the feeder lines to the individual apartments. When several meters are in a single location, it is possible for all of the meters to be locally connected to a single meter that contains remote communication capability. Thus, several meters can carry out AMR for the cost of only outfitting a single meter with network communication circuitry.

For example, it is known to have a single master meter coupled to a network via a telephone modem or the like, and have a plurality of slave meters communicate to the master meter using ANSI protocol communications on an RS 485 physical layer. The meter processing circuitry of the master meter operates as a communication server that obtains messages for any of the meter group, stores the messages, and then causes communication of information within the messages via the RS 485 physical layer to the appropriate slave meter.

A drawback to this approach is that telephone line modems operate at relatively low data rates and have other disadvantages. Moreover, the configuration of the communication server of the master meter can be time consuming and complex.

Accordingly, there is a need for method and arrangement for providing high speed communications to a plurality of meters that does not suffer the deficiencies of the prior art systems.

SUMMARY OF THE INVENTION

The present invention addresses the above described needs, as well as others by providing a meter having an Ethernet controller in a meter operably coupled to a multi-meter communication bus having a different signal protocol. The bus is used to communicate data to a plurality of meters, and the Ethernet controller allows the meters to be addressed using Ethernet network protocols.

In one embodiment, a metering arrangement includes at least a first and second meter. The first meter includes a first metrology circuit, an Ethernet controller, and an isolation circuit. The first metrology circuit has a first data interface. The Ethernet controller has an Ethernet port and a conversion circuit coupled to convert Ethernet standard signals having a first communication protocol to signals of a second communication protocol. The isolation circuit is coupled between the Ethernet controller and the first data interface. The Ethernet controller is operably coupled to communicate data with the first data interface via the isolation circuit, and the conversion circuit is further operably coupled to communicate data via the first data port. The second meter includes a second metrology circuit having a second data interface operably connected to a second data port. The second data port is operably coupled to communicate data with the first data port.

The above described features and advantages, as well as others, will become more readily apparent to those of ordinary skill in the art by reference to the following detailed description and the accompanying drawings.

DETAILED DESCRIPTION

Figure 1:
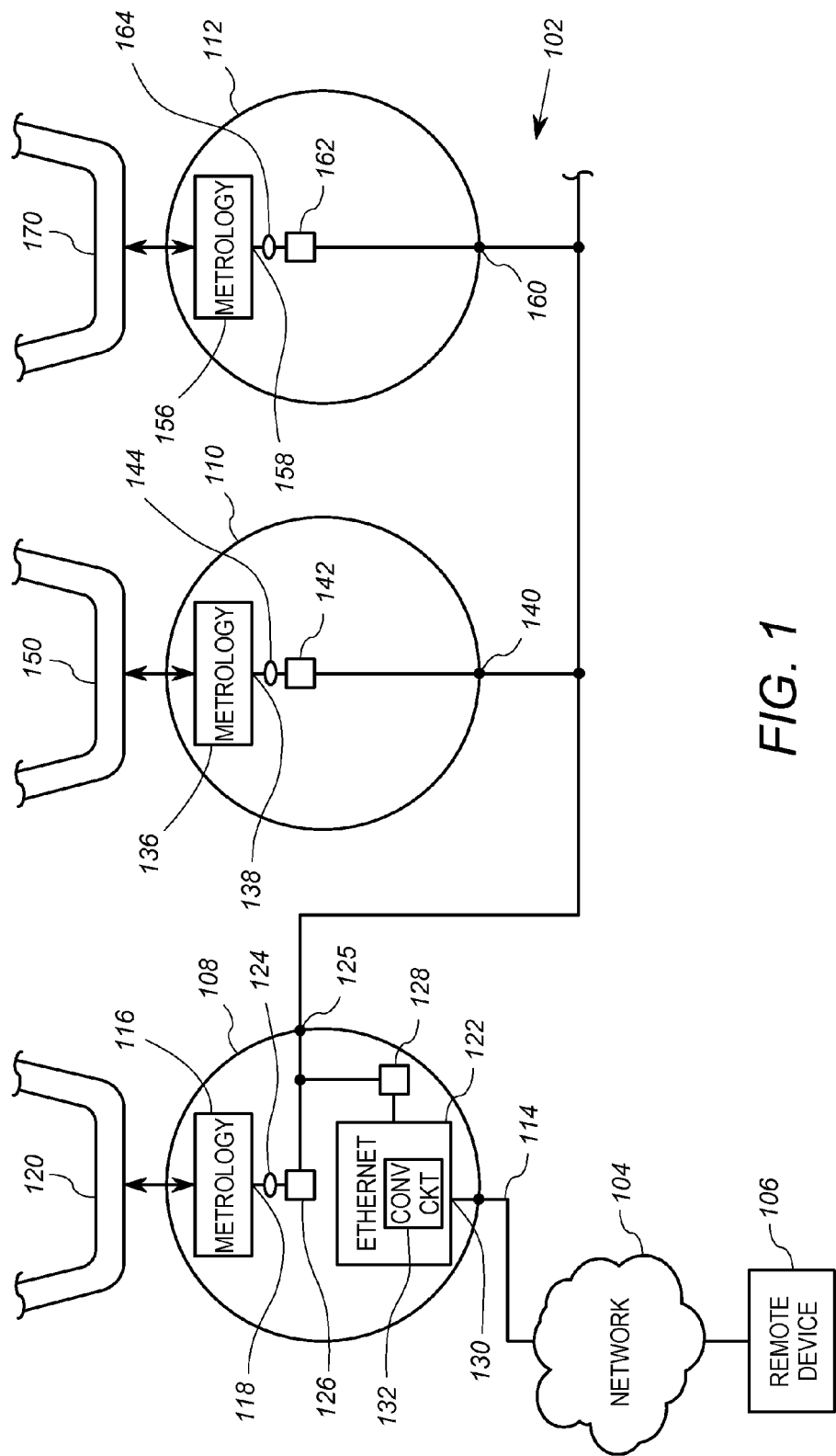
FIG. 1 shows a schematic block diagram of a meter communication system that includes a meter arrangement that incorporates a first embodiment of the invention.

FIG. 1 shows a schematic block diagram of a meter communication system 100 that includes a meter arrangement 102, a network 104 and a remote device 106. In general, the meter communication system 100 is designed to permit communications between the multiple meters 108, 110, 112 of the meter arrangement 102 and the remote device 106 via the network 104. The remote device 106 may suitably be a computer system of a utility service provider that is at least partly responsible for generating billing information for a plurality of customers associated with the meters 108, 110 and 112. The network 104 may comprise a plurality of networks, including the Internet. The network 104 includes an Ethernet link 114 operably coupled to the meter arrangement 102, as will be discussed below in further detail.

As discussed above, the meter arrangement 102 includes three electricity meters 108, 110 and 112. The three meters 108, 110 and 112 in this embodiment are relatively close to each other, such that communication between the meters 108, 110 and 112 via RS 485 communication lines is supported. It will be appreciated that the meter arrangement 102 may have fewer or more meters. The use of three meters 108, 110 and 112 is given by way of illustrative example only.

The first electricity meter 108 includes a metrology circuit 116 having a data interface 118, an Ethernet controller 122, an isolation circuit 124, and a data port 125. In this embodiment, the electricity meter 108 further includes protocol conversion circuits 126, 128. The metrology circuit 116 is a circuit that is operably coupled to measure electricity on a set of power lines 120. The power lines 120 deliver electricity from the utility service provider to a first customer load, not shown. The metrology circuit 116 may suitably include voltage and current sensors, digital processing circuitry and other devices, not shown, but which are commonly used in electricity metering. U.S. Pat. No. 7,805,262 and U.S. Pat. No. 8,432,655 disclose suitable metrology circuits that may be employed as the metrology circuit 116. As used herein, the metrology circuit 116 may also include a meter controller or microprocessor that performs various supervisory tasks within the meter, as well as digital signal processing of measurement signals. The metrology circuit 116 in this embodiment is further operable to communicate using serial data communications via the first interface 118.

The Ethernet controller 122 is a circuit, preferably a commercially available integrated circuit device, having an Ethernet port 130 and a conversion circuit 132 operably coupled to convert Ethernet standard signals having a first Ethernet communication protocol to signals of a second communications protocol. As used herein, communication protocol means a signal protocol that is not in (i.e. is above) the physical layer of the normal OSI layer standard, while a physical layer protocol is in the physical layer.

In this embodiment, the Ethernet controller 122 implements an Ethernet protocol including all the communication layers, physical, MAC, etc. required to fully implement 10/100 BaseT Ethernet communications. In other words, the Ethernet controller 122 implements both the Ethernet physical layer and the Ethernet (also referred to as TCP/IP) communication protocols for communications via the Ethernet port 130. The Ethernet communication protocol is referred to as the first communication protocol herein.

As discussed above, the Ethernet controller 122 is configured to convert between the first communication protocol and a second communication protocol. The second communication protocol is a simpler protocol that is compatible with the meter communication software used, for example, by the metrology circuit 116. The second communication protocol in this embodiment employs a start bit, a stop bit and 8 bits of message. In addition, in this embodiment, the conversion circuit 132 of the Ethernet controller 122 implements the second communication protocol signals on a singled-ended serial digital data physical layer protocol.

Accordingly, in this embodiment, the Ethernet controller 122 converts both the communication protocol and the physical layer protocol of the signals. Such controllers are known and include, by way of example, the XPORT Ethernet device server available from Lantronix. The Ethernet port 130 is operably connected to receive Ethernet signals from network 104 via the Ethernet link 114.

In general, the Ethernet controller 122, and particularly the conversion circuit 132 thereof, is operably coupled to communicate data in the second communication protocol with the data interface 118 via the isolation circuit 124, and to communicate data in the second communication protocol via the data port 125. As a result, the Ethernet controller 122 can facilitate communications between the remote device 106 (via the network 104) and both the metrology circuit 116 and at least one other meter via the data port 125. In this embodiment, Ethernet controller 122 communicates with the data interface via first and second protocol conversion circuits 126, 128, and communicates with the data port 125 via the second protocol conversion circuit 128. As will be discussed below, the protocol conversion circuits 126, 128 are configured to convert physical layer protocols of the second communication protocol signals.

The isolation circuit 124 is coupled between the Ethernet controller 122 and the data interface 118. In this embodiment, the isolation circuit 124 is coupled to the Ethernet controller 122 via the protocol conversion circuits 126 and 128. The isolation circuit 124 is a collection of devices that provide electrical isolation between the first interface 118 (and hence the metrology circuit 116) and the Ethernet link 114. In this embodiment, the isolation circuit 124 provides electrical isolation between the metrology circuit 116 and each of the protocol conversion circuits 126, 128 and the Ethernet controller 122. The isolation circuit 124 advantageously protects the Ethernet controller 122 (and hence the Ethernet link 114) from potential damage due to high voltages from the metrology circuit 116 in the event of certain types of failure.

Figure 2A:
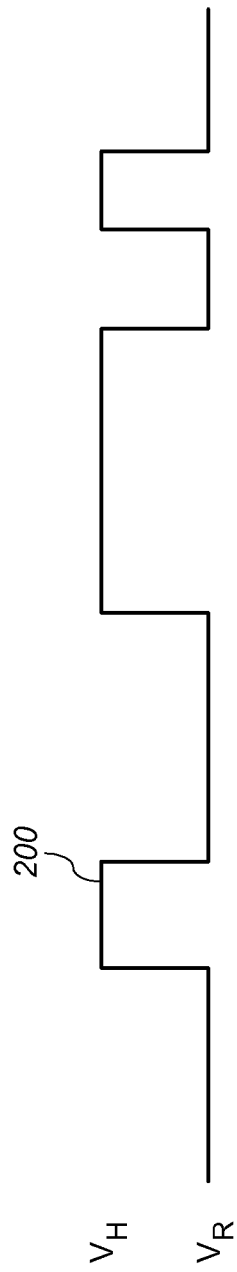
FIGS. 2a and 2b show timing diagrams of the same digital values transmitted within the meter arrangement of FIG. 1.
Figure 2B:
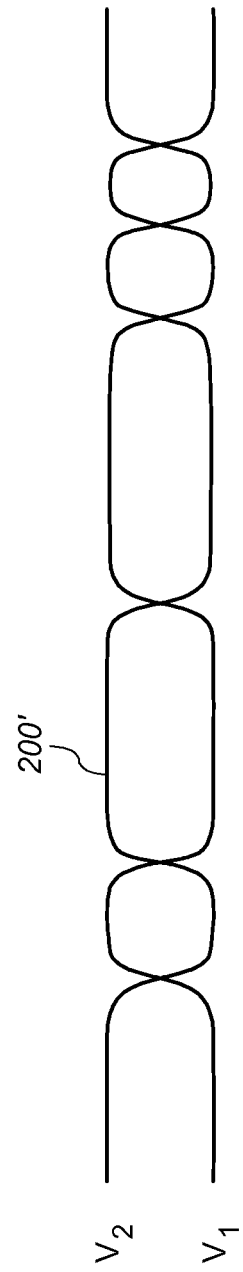

Each of the protocol conversion circuits 126, 128 is configured to convert serial data signals having a single-sided digital format to another physical layer protocol in the form of a differential digital signal format. In particular, single-sided signals are digital signals referenced to a DC reference voltage, such as ground. Differential digital signals are digital signals that are transmitted as a pair, wherein one signal has the opposite polarity of the other. Differential digital signals are used, for example, in RS 485 and Ethernet communications. By way of example, FIGS. 2a and 2b show timing diagrams 200, 200' of the same digital values being transmitted as a single-sided digital signal (FIG. 2a) and a differential digital signal (FIG. 2b).

In this embodiment the protocol conversion circuit 126 is operably coupled to communicate using single-sided digital signals with the data interface 118 via the isolation circuit 124, and to communicate using differential digital signals via the meter data port 125. Similarly, the protocol conversion circuit 128 is operably coupled to communicate using single-sided digital signals with the conversion circuit 132 of the Ethernet controller 122, and to communicate using differential digital signals via the meter data port 125.

Referring now to the second electricity meter 110, similar to the electricity meter 108, the electricity meter 110 includes a metrology circuit 136 having a data interface 138, a data port 140, a protocol conversion circuit 142 and an isolation circuit 144. The data port 140 operably coupled to communicate data with the data port 125, using the differential digital signal physical layer protocol.

The metrology circuit 136 is a circuit that is operably coupled to measure electricity on a set of power lines 150.

The power lines 150 deliver electricity from the utility service provider to a second customer load, not shown. The metrology circuit 136 may suitably include voltage and current sensors, digital processing circuitry and other devices, not shown, but which are commonly used in electricity metering. The metrology circuit 136 may, but need not, be of the same design as the metrology circuit 116 of the meter 108. As with the meter 108, the metrology circuit 136 may also include a meter controller or microprocessor that performs various supervisory tasks within the meter as well as digital signal processing of measurement signals. The metrology circuit 136 in this embodiment is further operable to communicate using serial data communications via the data interface 138. The metrology circuit 136, similar to the metrology circuit 116, implements the second or meter communication protocol.

The isolation circuit 144 is coupled between the data interface 138 and the protocol conversion circuit 142. The isolation circuit 144 is a collection of devices that provide electrical isolation between the data interface 138 (and hence the metrology circuit 136) and the data port 140. The isolation circuit 144 may suitably have a design similar to that of the isolation circuit 124 of the meter 108.

The protocol conversion circuit 142 is configured to convert serial data signals having a single-sided digital format (e.g. signal 200 of FIG. 2A) to another physical layer protocol in the form of a differential digital signal format (e.g. signal 200' of FIG. 2B). In this embodiment the protocol conversion circuit 142 is operably coupled to communicate using single-sided digital signals with the data interface 138 via the isolation circuit 144, and to communicate using differential digital signals via the meter data port 140.

Thus, unlike the meter 108, the meter 110 does not include an Ethernet controller 122 or Ethernet port 130. The data ports 125 and 140 are interconnected by a suitable cable, for example, a shielded cable carrying one or more twisted pairs for transmission of RS 485 signals.

Referring now to the meter 112, the meter 112 may suitably have the same design as the meter 110. Thus, the meter 112 includes a metrology circuit 156 having a data interface 158, a data port 160, a protocol conversion circuit 162 and an isolation circuit 164, all substantially identical to the corresponding parts of the meter 110. The data port 160 is operably coupled to communicate data with the data port 125, using the differential digital signal physical layer protocol.

In operation, the meters 108, 110, and 112 operate in an ongoing manner to measure and store accumulated energy usage information relating to the energy delivered to respective customers on respective power lines 120, 150 and 170. From time to time, the remote device 106 will poll one or more of the meters 108, 110, and 112 for such energy usage information. In some cases, the remote device 106 will establish communications with one or more of the meters 108, 110, and 112 for other purposes, such as to provide updates to the meter, or other commands, or to obtain diagnostic information from the meter.

To send a message to one of the meters 108, 110, and 112, the remote device sends a data signal to the target meter via the Ethernet controller 122. The data signal will include at least three pieces of information. The first is information is the internet TCP/IP protocol information required to establish a communication link with the Ethernet controller 122. The details of such first information would be known to those of ordinary skill in the art. The second is address data that identifies which of the meters 108, 110 and 112 the underlying message is intended for, and the third is the underlying message (e.g. request for energy consumption information, a meter firmware upgrade) to the target meter.

The Ethernet controller 122 receives the message, and parses the TCP/IP protocol information to receive the message, strips off the TCP/IP protocol layers, and provides serial data messages containing the meter address data and the underlying message to the protocol conversion circuit 128. Thus, the Ethernet controller 122 converts from the first (Ethernet) communication protocol to the second (meter) communication protocol. However, the Ethernet controller 122 does not identify or act upon the meter address data. The serial data messages provided by the Ethernet controller 122 are single-sided messages typical of a UART device-generated message. Thus, the Ethernet controller 122 also converts from the Ethernet physical layer protocol to single-sided serial data physical layer protocol.

The protocol conversion circuit 128 receives the serial data messages from the Ethernet controller 122 and converts the messages into a differential digital signal physical layer protocol. Preferably, the protocol conversion circuit 128 does not add or subtract header information, changing only the physical layer protocol of the message. Accordingly, the protocol conversion circuit 128 does not change the communication layer protocol from the meter communication protocol. Thus, the protocol conversion circuit 128 provides a differential data signal, which includes meter the address data and the underlying message, to the protocol converter 126 and the data port 125.

The protocol converter 126 receives the differential data signal and converts the signal back to a single-sided, serial data signal. The protocol converter 126 provides the single-sided serial data signal, which includes the meter address data and the underlying message, to the data interface 118 via the isolation circuit 124. At this point, the serial signal still has the second (meter) communication protocol. The isolation circuit 124 transfers the serial data signal essential intact, but over an electrically isolating interface.

The metrology circuit 116 receives the serial data signal and parses at least the address data to determine whether the message is intended for the meter 108. If not, then the metrology circuit 116 ignores the underlying message. If so, however, then the metrology circuit 116 parses the underlying message and takes appropriate action. For example, if the message contains a request for metering data, then the metrology circuit 116 generates a responsive message containing the metering data. The metrology circuit 116 then transmits, via the data interface 118, a response signal. Additional detail regarding transmission of data signals from the metrology circuit 116 to the remote device 106 is provided further below.

As discussed above, the protocol conversion circuit also 128 provides the incoming differential data signal, which includes the address data and the underlying message in the second (meter) communication protocol, to the data port 125. From the data port 125, the differential data signal, which may be an RS 485 physical layer protocol signal, propagates to the data ports 140 and 160.

In the second meter 110, the protocol converter 142 receives the differential data signal and converts the signal to a single-sided, serial data signal. The protocol converter 142 provides the single-sided serial data signal, which includes the address data and the underlying message in the second (meter) communication protocol, to the data interface 138 via the isolation circuit 144. The isolation circuit 144 transfers the serial data signal essential intact, but over an electrically isolating interface.

The metrology circuit 136 receives the serial data signal and parses at least the address data to determine whether the message is intended for the meter 110. If not, then the metrology circuit 136 ignores the underlying message. If so, however, then the metrology circuit 136 parses the underlying message and takes appropriate action, typically involving generating a response message.

In the third meter 112, the protocol converter 162 also receives the differential data signal and converts the signal to a single-sided, serial data signal. As with the protocol converters 126 and 142, the protocol converter 162 provides the single-sided serial data signal, which includes the address data and the underlying message, to the data interface 158 via the isolation circuit 164.

The metrology circuit 156 receives the serial data signal and parses at least the address data to determine whether the message is intended for the meter 112. If not, then the metrology circuit 156 ignores the underlying message. If so, however, then the metrology circuit 156 parses the underlying message and takes appropriate action, typically involving generating a response message.

The communication of upstream signals from each of the metrology circuits 116, 136 and 156 will now be discussed. When the metrology circuit 116 generates a response signal for the remote device 106, it generates a responsive message as serial data in single-sided digital signal format. In particular, the response message serial data signal is sent using standard UART techniques. The signal will have the second communication protocol. The data interface 118 provides the response message serial data signal to the protocol conversion circuit 126, which generates converts the response message signal to the differential physical layer protocol (e.g. RS 485 format). The response message differential signal is thus provided to the protocol conversion circuit 128 and the data port 125. The data port 125 propagates the response message signal to the meters 110, 112 (and hence there metrology circuits 136, 156) in the manner discussed above. However, the response message does not have address data corresponding to the meters 110, 112, and thus the response message is ignored by the metrology circuits 136, 156.

The protocol conversion circuit 128 also receives and converts the response message differential signal to a single-sided serial data signal, still having the second communication protocol. The protocol conversion circuit 128 provides the resulting signal to the Ethernet controller 122. The Ethernet controller 122 receives the response message serial data signal and generates a TCP/IP or Ethernet (i.e. first) communication protocol message containing the response message. The Ethernet controller 122 provides the generated first communication protocol message containing the response message to the Ethernet link 114 via the Ethernet port 130. To this end, the conversion circuit 132 furthermore generates the signal in the Ethernet physical layer protocol. The TCP/IP protocol message propagates to the remote device 106 via the Ethernet link 114 and network(s) 104.

In a similar manner, when the metrology circuit 136 generates a response signal for the remote device 106, it also generates a responsive message in serial data, single-sided digital signal format in the second communication protocol. In particular, the response message serial data signal is sent using standard UART techniques. The data interface 138 provides the response message serial data signal to the protocol conversion circuit 142, which generates converts the response message signal to the differential physical layer protocol (e.g. RS 485 format). The response message differential signal is thus provided to the data port 140. The response message signal propagates from the data port 140 to the data ports 125, 160 (and hence the meters 108, 112). Thus, the response message differential signal propagates to the protocol conversion circuits 126 and 128 of the meter 108, and to the protocol conversion circuit 162 of the meter 112. The protocol conversion circuit 162 converts the signal to a single-sided serial data signal and provides the signal with the response message to the metrology circuit 156 via the isolation circuit 164 and data interface 158. Similarly, the protocol conversion circuit 126 converts the signal to a single-sided serial data signal and provides the signal with the response message to the metrology circuit 116 via the isolation circuit 124 and data interface 118. The response message does not have address data corresponding to the meters 108, 112, and thus the response message is ignored by the metrology circuits 116, 156.

Again, however, the protocol conversion circuit 128 converts the response message differential signal to a single-sided serial data signal and provides the resulting signal, still in the second communication protocol, to the Ethernet controller 122. The Ethernet controller 122 receives the response message serial data signal and generates a first communication protocol (TCP/IP or Ethernet) message containing the response message. The conversion circuit 132 provides the generated TCP/IP protocol message in the Ethernet physical layer protocol to the Ethernet link 114 via the Ethernet port 130. The TCP/IP protocol message propagates to the remote device 106 via the Ethernet link 114 and network(s) 104.

The transmission of a response message from the metrology circuit 156 of the third meter 112 to the remote device 106 occurs in a manner similar to that of the transmission of a response message from the metrology circuit 136 to the remote device 106, discussed above.

Accordingly, the communication arrangement 102 operates such that the first meter 108 operates as a master, which receives Ethernet messages (of the first communication protocol) and converts them to a signal format (second communication protocol) used by the meters 108, 110 and 112. Moreover, the first meter 108 is set up such that the metrology circuit 116 operates the same way as the metrology circuits 136, 156. In other words, the processing circuits and software of the metrology circuit 116 do not have to be specially configured simply because they are located within the meter 108. The Ethernet controller 122 and the protocol conversion circuit 128 cooperate to form as an independent conduit to the network connecting all of the metrology circuits 116, 136 and 156. This provides an advantage of not requiring special software in the metrology circuit 116.

Figure 3:
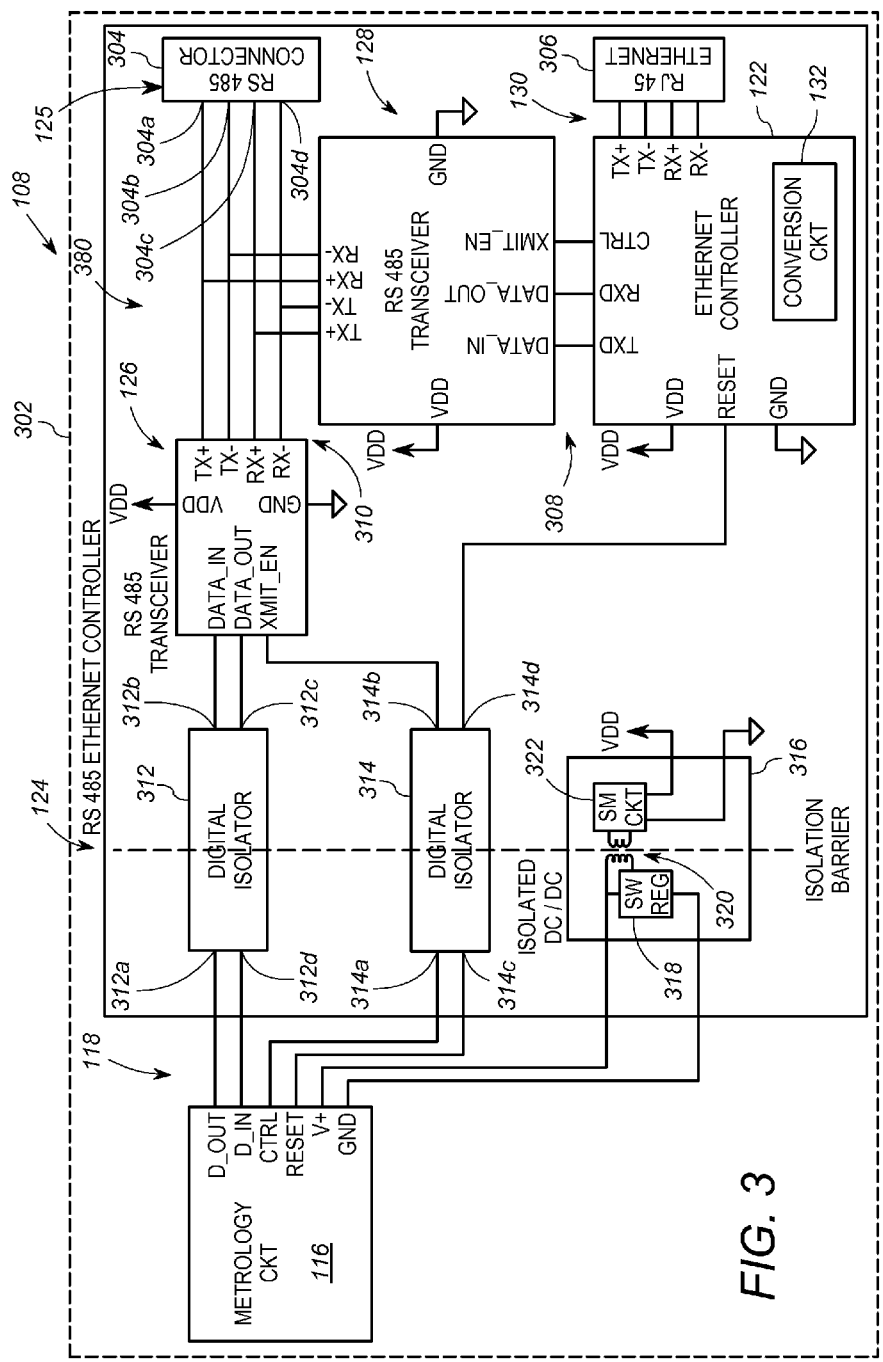
FIG. 3 shows in further detail a schematic block diagram of an exemplary embodiment of a meter of the meter arrangement of FIG. 1.

FIG. 3 shows in further detail a schematic block diagram of an exemplary embodiment of the meter 108. It will be appreciated that the one or more inventive aspects described herein may be implemented in many other configurations of electricity meters. The exemplary embodiment of FIG. 3 has additional features that are advantageous, as will be discussed below. The same reference numbers will be used to describe the corresponding elements in both FIGS. 1 and 3.

As shown in FIG. 3 the meter 108 also includes a housing 302 that supports the metrology circuit 116, the data interface 118, the isolation circuit 124, the protocol conversion circuits 126, 128, the Ethernet controller 122 and the data port 125. Various meter housing types, forms and shapes are known and are suitable for use as the housing 108. For example, in meters used in the United States, electricity meter housings are generally cylindrical in shape, while in other countries, the housing may be rectangular in shape. The housing 302 generally protects the components of the meter 108 from environmental conditions, thereby allowing the meter 108 to be placed outside, in an industrial setting, or elsewhere.

In this embodiment, the external access through the housing is provided by the RS 485 connector 304, which serves as the data port 125, and an RJ 45 Ethernet connector, which connects directly to the Ethernet port 130 of the Ethernet controller 122. As shown in FIG. 3, the Ethernet port 130 includes four terminals, two Ethernet transmission terminals TX and two Ethernet reception terminals RX. In addition to the Ethernet port 130, the Ethernet controller 122 further includes a serial data transmit terminal TXD, a serial data receive terminal RXD, and a transmit control terminal CONTROL. The Ethernet controller 122 also includes a bias voltage input VDD, a reference voltage (e.g. ground) input GND, and a reset pin RESET.

The Ethernet controller 122 is configured to receive Ethernet signals at the terminals RX, and provide corresponding serial data signals (typically single-sided digital signals) at its serial data transmit terminal TXD. To this end, the Ethernet controller 122 includes logic for processing TCP/IP signals to determine whether an incoming signal is intended for the Ethernet controller 122. If so, then the Ethernet controller 122 is further configured to strip off layers of the TCP/IP communication protocol and provide payload data in the second (meter) communication protocol, also in singled-sided physical layer, to the data transmit terminal TXD. Similarly, the Ethernet controller 122 is configured to receive serial data signals in the second (meter) communication protocol at its receive data port RXD and package those signals in a TCP/IP communication protocol signal for transmission via the Ethernet transmit port TX. To this end, application firmware running in the Ethernet controller 122 recognized the information as that requested by the remote entity that initially established the communication session. By way of example, the XPORT Ethernet device driver, available from Lantronics, Inc., is suitable for use as the Ethernet controller 122.

The protocol conversion circuit 128 in this embodiment is a RS 485 transceiver, such as a MAX13432 transceiver available from Maxim Integrated. The protocol conversion circuit 128 includes a serial data interface 308 including a data-in terminal DATA_IN, a data-out terminal DATA_OUT and a transmit-enable terminal XMIT_EN. The protocol conversion circuit 128 also includes RS 485 differential transmit terminals TX+, TX−, and RS 485 differential receive terminals RS+, RX−. The protocol conversion circuit 128 includes also a bias voltage input VDD and a reference voltage (e.g. ground) input GND. The protocol conversion circuit 128 is configured to receive serial, single-sided asynchronous digital signals at its DATA_IN terminal and convert the data signals into differential, RS 485 signals. The protocol conversion circuit 128 is configured to provide the RS 485 signals on the terminals TX+ and TX− for transmission, upon receipt of a transmit enable signal on the transmit-enable terminal XMIT_EN. The protocol conversion circuit 128 is further configured to receive differential RS 485 signals at the terminals RX+ and RX−, and convert the signals to serial, single-sided asynchronous digital signals. The protocol conversion circuit 128 is configured to provide those signals on its DATA_OUT terminal as an output. As discussed above, the protocol conversion circuit 128 does not alter the communication protocol of the signals passing therethrough The terminal DATA_IN of the protocol conversion circuit 128 is operably coupled to the terminal TXD of the Ethernet controller 122, and the terminal DATA_OUT is operably coupled to the terminal RXD of the Ethernet controller 122. The terminals TX+, TX−, RX+ and RX− are operably coupled to, respectively, terminals 304c, 304d, 304a and 304b of the RS 485 connector 304. Collectively, the lines connecting to terminals 304a-304d form an RS 485 bus 380.

The protocol conversion circuit 126 in this embodiment is also an RS 485 transceiver, such as a MAX13432 transceiver discussed above. Accordingly, the protocol conversion circuit 126 also includes a serial data interface 310 including a data-in terminal DATA_IN, a data-out terminal DATA_OUT and a transmit-enable terminal XMIT_EN. The protocol conversion circuit 126 includes RS 485 differential transmit terminals TX+, TX−, and RS 485 differential receive terminals RX+, RX−. The protocol conversion circuit 128 further includes a bias voltage input VDD and a reference voltage (e.g. ground) input GND. The protocol conversion circuit 126 is configured in the same manner as the protocol conversion circuit 128.

The terminals DATA_IN and DATA_OUT of the protocol conversion circuit 126 are operably coupled to the isolation circuit 124, as will be discussed in detail further below. The terminals TX+, TX−, RX+ and RX− are operably coupled to, respectively, terminals 304a, 304b, 304c and 304d of the RS 485 connector 304. Accordingly, it can be seen that that the transmit terminals TX+, TX− of the protocol conversion circuit 126 are operably coupled to the receive terminals RX+, RX− of the protocol conversion circuit 128, and the receive terminals RX+, RX− of the protocol conversion circuit 126 are operably coupled to the transmit terminals TX+, TX− of the protocol conversion circuit 128. This feature of the bus 380 allows for full duplex communications between the metrology circuit 116 and the Ethernet controller 122.

However, it will be appreciated that the protocol conversion circuits 126, 128, 142 and 162 can be configured for half-duplex communications, using the XMIT_EN pin for transmission control. Thus, the embodiment described herein can be flexible for different meter communication formats.

Referring now to the metrology circuit 116, the metrology circuit 116 may take many forms. As discussed above, the metrology circuit 116 can include voltage and current sensors, as well as one or more processing devices. The details of suitable metrology circuits are well known in the art, and omitted for clarity of exposition. In general, however, the form of the metrology circuit 116 should include at least one processing device or processing unit that can receive and transmit digital data in the second communication protocol. Preferably, the metrology circuit 116 is configured to, among other things, receive requests for metering information, and to provide data messages including such metering information in reply and also to receive firmware upgrades in the field.

In this embodiment, the metrology circuit 116 includes a digital data output D_OUT, a digital data input D_IN, a control output CTRL, a reset output RESET, an unregulated voltage output V+, and a ground pin GND. It will be appreciated that some, but not necessarily all, of the terminals D_OUT, D_IN, CTRL, RESET, V+ and GND may be operably coupled to a processing unit within the metrology circuit 116. By contrast, the unregulated voltage output V+ and ground pin GND may be coupled to a power supply within the metrology circuit 116.

In other embodiments, the metrology circuit 116 may have different inputs and outputs. At a minimum, however, the metrology circuit 116 will include one or more data input/outputs for communications. In at least some embodiments, it is advantageous to include a power output that will be used, after isolation by the isolation circuit 124, to provide power to the Ethernet controller 122 and the conversion circuits 126 and 128. In this embodiment, it is further advantageous to include the reset signal output RESET to allow the metrology circuit 116 to effectuate a reset of the Ethernet controller 122, for example, after a power outage.

In this embodiment, the entire metrology circuit 116 is electrically isolated from the Ethernet control 122 and the protocol conversion circuits 126, 128. To this end, the isolation circuit 124 is configured to provide a 2.5 kV rms isolated interface between the terminals D_OUT, D_IN, CTRL, RESET, V+ and GND and the elements 122, 126 and 128 (as well as the bus 380). The isolation circuit 124 in this embodiment is a collection of elements, including two signal isolation chips 312, 314 and a DC-DC isolated power converter 316. The DC-DC isolated power converter 316 in this embodiment is a switching power converter that employs an isolated flyback switching regulator 318 coupled to a primary winding of an isolation transformer 320, and a smoothing circuit 322 coupled to the secondary of the transformer 320. The switching regulator 318 may suitably be a model LT1425 available from Linear Technology. The switching regulator 318 is operably coupled to an unregulated DC voltage output VUNREG of the metrology circuit 116, and the smoothing circuit 322 is operably coupled to provide a regulated DC bias voltage to the VDD terminals of the Ethernet control 122 and the protocol conversion circuits 126, 128. The regulated DC bias voltage is electrically isolated from the output VUNREG and all other elements of the metrology circuit 116.

Each of the signal isolation chips 312, 314 is a circuit that is configured to pass digital logic signals from input pins to corresponding output pins in an electrically isolated manner. It will be appreciated that the number of inputs and outputs per chip 312, 314 is a matter of design choice and can be any suitable number. In this embodiment, the isolation chip 312 includes a first input 312a operably coupled to the output D_OUT of the metrology circuit 116, a first output 312b operably coupled to the terminal DATA_IN of the protocol conversion circuit 126. The isolation chip 312 also includes a second input 312c operably coupled to the terminal DATA_OUT of the protocol conversion circuit 126, and a second output 312d operably coupled to the input D_IN of the metrology circuit 116.

The isolation chip 314 includes a first input 314a operably coupled to the output CTRL of the metrology circuit 116, a first output 314b operably coupled to the terminal XMIT_EN of the protocol conversion circuit 126. The isolation chip 314 also includes a second input 312c operably coupled to the output RESET of the metrology circuit 126, and a second output 314d operably coupled to the terminal RESET of the Ethernet controller 122. It will be appreciated that the couplings between the isolation circuit 124 and the metrology circuit 116 described above may each further include signal buffers, surge protection elements, and the like, as would be conventional.

Figure 4:
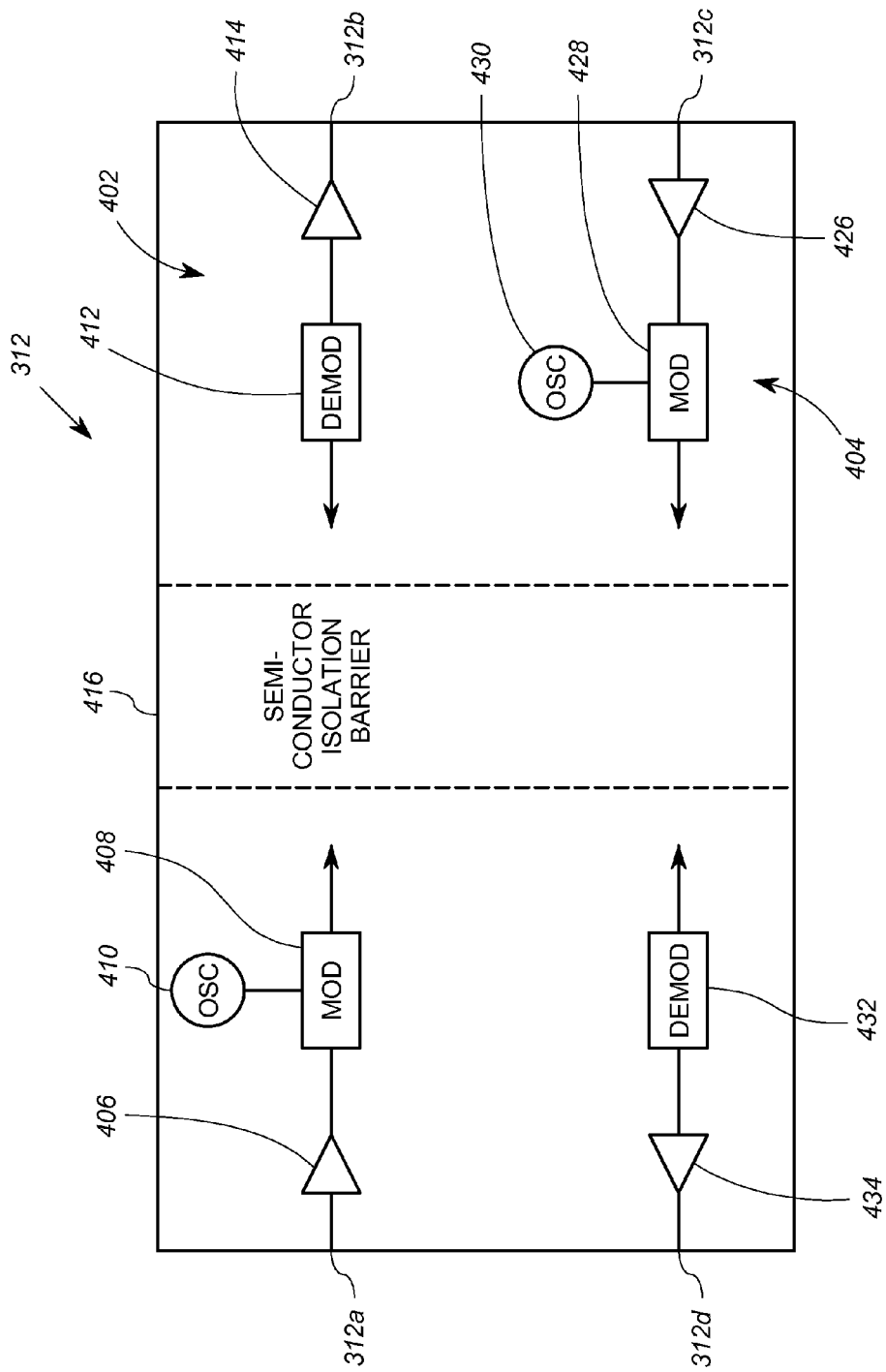
FIG. 4 shows a schematic block diagram of an exemplary embodiment of an isolation circuit of the meter of FIG. 3.

To provide the electrically isolated coupling, each isolation chip 312, 314 may suitably include optical couplings between each input and its corresponding output, not shown in FIG. 3, but which are known in the art. In this embodiment, however, each of the isolation chips 312, 314 includes an RF coupling circuit between each input and output. FIG. 4 shows a schematic block diagram of an exemplary embodiment of the chip 312. The same general architecture may suitably be employed by the chip 314. In general, the isolation chips 312, 314 may suitably be the SI8621 model digital isolator available from Silicon Labs.

Referring to FIG. 4, the isolation chip 312 includes a first RF isolation circuit 402 and a second RF isolation circuit 404. The first RF isolation circuit 402 is configured to provide isolation between the first input 312a and the first output 312b using RF transmission. Similarly, the second RF isolation circuit 404 is configured to provide isolation between the second input 312c and the second output 312d using RF transmission.

The first RF isolation circuit 402 includes an amplifier 406, a modulator 408, an oscillator 410, a demodulator 412 and another amplifier 414. The amplifier 406 is operably connected to amplify signals received at the first input 312a and provide the amplified signals to the modulator 408. The oscillator 410 is operably coupled to provide an RF carrier signal to the modulator 408. The modulator 408 is configured to modulate the amplified signals received from the amplifier 406 onto the RF carrier signal, and to transmit the RF carrier signal through the semiconductor isolation barrier 416 of the chip 312. The demodulator 412 is configured to receive the signal transmitted by the modulator 408, and to demodulate the signal to obtain a signal substantially representative of the original (baseband) signal modulated by the modulator 408. The amplifier 414 is operably coupled to receive the demodulated signal and provide amplification to the demodulated signal. The amplifier 414 is operably coupled to provide the amplified baseband signal, which is substantially a copy of the signal received at the input 312a, to the output 312b.

The second RF isolation circuit 404 is configured in substantially the same way. The second RF isolation circuit 404 includes an amplifier 426, a modulator 428, an oscillator 430, a demodulator 432 and another amplifier 434. The amplifier 426 is operably connected to amplify signals received at the second input 312c and provide the amplified signals to the modulator 428. The oscillator 430 is operably coupled to provide an RF carrier signal to the modulator 428. The modulator 428 is configured to modulate the amplified signals received from the amplifier 426 onto the RF carrier signal, and to transmit the RF carrier signal through the semiconductor isolation barrier 416 of the chip 312. The demodulator 432 is configured to receive the signal transmitted by the modulator 428, and to demodulate the signal to obtain a signal substantially representative of the original (baseband) signal modulated by the modulator 428. The amplifier 434 is operably coupled to receive the demodulated signal and provide amplification to the demodulated signal. The amplifier 434 is operably coupled to provide the amplified baseband signal, which is substantially a copy of the signal received at the input 312c, to the output 312d.

Referring again to FIG. 3, the operation of the meter 108 of FIG. 3 is essentially the same as that described above in connection with FIG. 1. It will be appreciated that the slave meters 110 and 112 will have a similar structure, without the protocol conversion circuit 128 and without the Ethernet controller 122 or Ethernet port 130. In other words, the protocol conversion circuit 142, the isolation circuit 144 and the data interface 138 of the meter 110 may suitably have substantially the same structure and be interconnected in substantially the same way as, respectively, the protocol conversion circuit 126, the isolation circuit 124, and the data interface 118 of FIG. 3. Likewise, the protocol conversion circuit 162, the isolation circuit 164 and the data interface 158 may suitably have substantially the same structure and be interconnected in substantially the same way as, respectively, the protocol conversion circuit 126, the isolation circuit 124, and the data interface 118 of FIG. 3.

One of the advantages of the embodiments described herein is that the meter 108 essentially provides a common bus 380 (i.e. the lines connected to the data port 125) on which the Ethernet controller 122, the metrology circuit 116 of the meter 108, the metrology circuit 136 of the meter 110, and the metrology circuit 156 of the meter 112 can exchange data. In this embodiment, the common bus 380 uses a differential data protocol in the form of full duplex RS 485 signals. Full duplex is enabled because essentially all communications on the bus 380 are between the Ethernet controller 122 and one of the metrology circuits 116, 136 and 156. Thus, all of the TX+ and TX− lines of the protocol conversion circuits 126, 142 and 162 may be connected to each other because those devices do not communicate with each other. Similarly, all of the RX+ and RX− lines of the protocol conversion circuits 126, 142 and 162 may be connected to each other. The RX and TX lines of the protocol conversion circuit 128, however are connected in the inverse, as discussed further above in connection with FIG. 3, thus allowing full duplex communications between the Ethernet control 122 and each of the metrology circuits 126, 142 and 162.

It will further be appreciated that the XMIT_EN terminals of the protocol conversion circuits 126, 128, etc., allow for the multi-drop full-duplex configuration.

It will also be noted that the Ethernet controller 122 and the protocol conversion circuit 128 in this embodiment act together as a conversion circuit configured to, among other things, convert between Ethernet physical and communication layer protocol signals and signals that employ the second communication protocol and the RS 485 physical layer protocol. Although these functions are carried out in this embodiment by separate, commercially available devices, other configurations, including a single packaged device, may be employed to provide such conversions.

It will therefore be appreciated that the above-described embodiments are merely illustrative, and that those of ordinary skill in the art may readily devise their own implementations and modifications that incorporate the principals of the present invention and fall within the spirit and scope thereof.

I claim:

1. A metering arrangement, comprising: a first meter, comprising
   a first metrology circuit having a first data interface;
   an Ethernet controller having an Ethernet port and a conversion circuit coupled to convert Ethernet standard signals having a first communication protocol to signals of a second communication protocol;
   an isolation circuit coupled between the Ethernet controller and the first data interface;
   wherein the Ethernet controller is operably coupled to communicate data with the first data interface via the isolation circuit, and the conversion circuit is further operably coupled to communicate data via a first data port; a second meter, comprising
   a second metrology circuit having a second data interface operably connected to a second data port, the second data port operably coupled to communicate data with the first data port.

2. The meter arrangement of claim 1, wherein the Ethernet controller is operably coupled to communicate data with the first metrology circuit and the second metrology circuit via the conversion circuit.

3. The meter arrangement of claim 1, wherein the first meter further includes a first protocol conversion circuit operably coupled between the conversion circuit and the first data interface, the first protocol conversion circuit configured to convert data signals having a first physical layer protocol to data signals having a second physical layer protocol.

4. The meter arrangement of claim 3, wherein the first protocol conversion circuit is configured to convert between first data signals and RS 485 differential data signals.

5. The meter arrangement of claim 4, wherein the isolation circuit is operably coupled between the first protocol conversion circuit and first data interface.

6. The meter arrangement of claim 5, wherein the first data interface includes a transmit line, a receive line, and a transmit enable line.

7. The meter arrangement of claim 6, wherein the isolation circuit includes a first RF transmitter operably coupled to receive transmit data signals from the transmit line, and a first RF receiver operably coupled to provide transmit data signals to the protocol conversion circuit.

8. The meter arrangement of claim 3, further comprising a second protocol conversion circuit operably coupled between the first data interface and the first data port.

9. The meter arrangement of claim 8, wherein the first protocol conversion circuit and the second protocol conversion circuit are substantially identical.

10. The meter arrangement of claim 1, wherein the isolation circuit is operably connected to provide electrical isolation between the Ethernet controller and the first data interface.

11. A meter communication system, comprising
    a first metrology circuit having a first data interface;
    a first conversion circuit configured to convert Ethernet protocol signals to data signals of a second protocol, the first conversion circuit configured to be coupled to source of Ethernet communication protocol signals and to a first data port;
    a second conversion circuit coupled between the first data interface and the first data port, the second conversion circuit operably coupled to receive signals from the first data interface and convert the signals to data signals of the second protocol; and
    an isolation circuit coupled between the first data interface the second conversion circuit.

12. The meter communication arrangement of claim 11, wherein the isolation circuit includes a plurality of RF transmitters and a corresponding plurality of RF receivers.

13. The meter communication arrangement of claim 11, wherein the second conversion circuit is configured to convert single-ended data signals to differential data signals.

14. The meter communication arrangement of claim 13, wherein the second conversion circuit comprises an RS 485 transceiver.

15. The meter communication arrangement of claim 14, wherein the first conversion circuit comprises an Ethernet controller and a second RS 485 transceiver.

16. The meter communication arrangement of claim 11, wherein the second protocol includes a differential signal physical layer protocol.

17. The meter communication arrangement of claim 16, wherein the second protocol includes a full duplex differential signal physical layer protocol.

18. The meter arrangement of claim 11, wherein the first data interface includes a transmit line, a receive line, and a transmit enable line.

19. The meter arrangement of claim 18, wherein the isolation circuit includes a first RF transmitter operably coupled to receive transmit data signals from the transmit line, and a first RF receiver operably coupled to provide transmit data signals to the second conversion circuit.

20. The meter communication arrangement of claim 19, wherein the second conversion circuit is configured to convert single-ended data signals to differential data signals.

21. The meter communication arrangement of claim 11, wherein the first conversion circuit comprises an Ethernet controller and a second RS 485 transceiver.

\* \* \* \* \*